(12) United States Patent
Kupferman et al.

(10) Patent No.: US 10,769,511 B2
(45) Date of Patent: Sep. 8, 2020

(54) LOW ENERGY TRANSMITTER

(71) Applicant: Wiliot, LTD., Caesarea (IL)

(72) Inventors: Sagi Kupferman, Herzliya (IL); Alon Yehezkely, Haifa (IL)

(73) Assignee: Wiliot, Ltd, Caesarea (IL)

( * ) Notice: Subject to any disclaimer, the term of this patent is extended or adjusted under 35 U.S.C. 154(b) by 0 days.

(21) Appl. No.: 16/238,976

(22) Filed: Jan. 3, 2019

(65) Prior Publication Data
US 2020/0218955 A1 Jul. 9, 2020

(51) Int. Cl.
*G06K 19/07* (2006.01)
*H03F 3/45* (2006.01)

(52) U.S. Cl.
CPC ..... *G06K 19/0723* (2013.01); *G06K 19/0709* (2013.01); *H03F 3/45264* (2013.01); *H03F 3/45636* (2013.01); *H03F 2200/451* (2013.01); *H03F 2203/45528* (2013.01)

(58) Field of Classification Search
CPC ........ G06K 19/00; G06K 19/04; G06K 19/06; G06K 19/07
USPC ......................................... 235/492, 487, 375
See application file for complete search history.

(56) References Cited

U.S. PATENT DOCUMENTS

| | | | |
|---|---|---|---|
| 5,994,963 A * | 11/1999 | Kawai | H03F 1/306 330/277 |
| 6,215,816 B1 | 4/2001 | Gillespie et al. | |
| 9,743,357 B2 | 8/2017 | Tabe | |
| 2005/0122180 A1 * | 6/2005 | Khalil | H03B 5/1228 331/117 FE |
| 2012/0064952 A1 * | 3/2012 | Iijima | H03K 17/6221 455/571 |
| 2012/0106219 A1 * | 5/2012 | Okuda | G06K 7/10237 363/127 |

(Continued)

FOREIGN PATENT DOCUMENTS

| EP | 972341 B1 | 6/2003 |
|---|---|---|
| WO | 2007109451 A2 | 9/2007 |

OTHER PUBLICATIONS

Chuo, et al., "A 915MHz Asymmetric Radio Using Q-Enhanced Amplifier for a Fully Integrated 3×3×3mm3 Wireless Sensor Node with 20m Non-Line-of-Sight Communication", Wireless Transceivers, 2017 IEEE International Solid-State, Circuits Conference, Ann Arbor, Michigan, pp. 132-134.

(Continued)

*Primary Examiner* — Edwyn Labaze
(74) *Attorney, Agent, or Firm* — M&B IP Analysts, LLC

(57) ABSTRACT

Disclosed include methods and devices for enabling a battery free Bluetooth low energy communication. Some embodiments include a transmitter and a reference voltage generator supplying a voltage to an oscillator circuit. Further, some embodiments include an oscillator circuit including two pairs of semiconductor devices, wherein each pair of a semiconductor device includes a device with a gate node coupled to an antenna positive node interface (Vop) via a capacitor and a drain connected to an antenna negative node interface (Von) and a device with a gate node coupled to an antenna positive node interface (Von) via a capacitor and a drain connected to an antenna negative node interface (Vop). Additionally, some embodiments include an oscillator circuit connected to a common mode feedback circuit.

19 Claims, 3 Drawing Sheets

(56) References Cited

U.S. PATENT DOCUMENTS

| | | | |
|---|---|---|---|
| 2013/0044838 A1* | 2/2013 | Ding | H03B 5/1228 |
| | | | 375/340 |
| 2014/0266478 A1* | 9/2014 | Gaied | H03L 7/02 |
| | | | 331/1 R |
| 2016/0373058 A1* | 12/2016 | Murphy | H03B 5/1284 |

OTHER PUBLICATIONS

Fanori, et al., "A 2.5-to-3.3GHz CMOS Class-D VCO", Frequency Generation, 2013 IEEE International Solid-State Circuits Conference, Lund, Sweden, pp. 346-348.

Mercier, et al., "A Sub-nW 2A GHz Transmitter for Low Data-Rate Sensing Applications", IEEE Journal of Solid-State Circuits, vol. 49, No. 7, Jul. 2014, pp. 1463-1474.

The International Search Report and The Written Opinion for PCT/US2019/058279, dated Feb. 6, 2020, ISA, RU, Moscow, Russia.

* cited by examiner

LOW ENERGY TRANSMITTER

TECHNICAL FIELD

The present disclosure generally relates to low-power transmitters operable of Internet of things (IoT) devices.

BACKGROUND

The Internet of things (IoT) is the inter-networking of physical devices, vehicles, buildings, and other items embedded with electronics, software, sensors, actuators, and network connectivity that enable these objects to collect and exchange data. IoT is expected to offer advanced connectivity of devices, systems, and services that goes beyond machine-to-machine (M2M) communications and covers a variety of protocols, domains, and applications.

IoT can be encapsulated in a wide variety of devices, such as heart monitoring implants; biochip transponders on farm animals; automobiles with built-in sensors; automation of lighting, heating, ventilation, air conditioning (HVAC) systems; and appliances such as washer/dryers, robotic vacuums, air purifiers, ovens or refrigerators/freezers that use Wi-Fi for remote monitoring. Typically, IoT devices encapsulate wireless sensors or a network of such sensors.

Most IoT devices are wireless devices that collect data and transmit such data to a central controller. There are a few requirements to be met to allow widespread deployment of IoT devices. Such requirements include reliable communication links, low energy consumption, and low maintenance costs.

To this aim, an IoT device and connected wireless sensors are designed to support low power communication protocols, such as Bluetooth low energy (BLE), LoRa, and the like. However, IoT devices utilizing such protocols require a battery, for example, a coin battery. The reliance on a power source such as a battery, is a limiting factor for electronic devices, due to, for example, cost, size, lack of durability to environmental effects, and frequent replacement. As an alternative to using batteries, power may be harvested from sources such as light, movement, and electromagnetic power such as existing radio frequency transmissions. In order to minimize the power consumption, IoT devices are designed with the minimum required components, or implementing low-power consumption oscillators.

Conventional RF circuitry (such as amplifiers and oscillators) may use a central-tap on the inductor/transformer to bias the circuit devices (for example, to provide a supply). Some oscillator devices are typically referred to conventional internal local oscillators and power oscillators interface with the antenna (i.e., there is no active amplifying or buffering stage between the oscillator and the transmission antenna). When used in an antenna, the central tap connection adds an on-substrate trace that may impact antenna radiation, and may limit the antenna type, since it requires a point on the antenna that has a DC-short to the oscillator AC ports. In low cost substrate solutions such as a Polyethylene terephthalate (PET) and paper, single-layer materials may be used to reduce cost, or only a single layer used for routing.

This may further limit a center-tap connection. Eliminating the central tap may impose a challenge on the oscillator bias. This is in addition to the challenge of biasing the oscillator which has a very low supply voltage. Lowering the supply of the oscillator to <200 mV range enables sufficiently low power consumption but comes with bias voltages that are outside the 0V-200 mV range, given the topology that avoids the central tap.

It would therefore be advantageous to provide a solution to design a transmitter without using very low power requirements that would overcome the challenges noted above.

SUMMARY

A summary of several example embodiments of the disclosure follows. This summary is provided for the convenience of the reader to provide a basic understanding of such embodiments and does not wholly define the breadth of the disclosure. This summary is not an extensive overview of all contemplated embodiments, and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the term "certain embodiments" may be used herein to refer to a single embodiment or multiple embodiments of the disclosure.

Certain embodiments disclosed herein include a low energy transmitter with an oscillator circuit and a reference voltage generator. The reference voltage generator may be adapted to supply a voltage to the oscillator circuit. The oscillator circuit may include two pairs of semiconductor devices, wherein each pair of a semiconductor device includes a device with a gate node coupled to an antenna positive node interface (Vop) via a capacitor and a drain connected to an antenna negative node interface (Von) and a device with a gate node coupled to an antenna positive node interface (Von) via a capacitor and a drain connected to an antenna negative node interface (Vop). The oscillator circuit may be further connected to a common mode feedback circuit.

Certain embodiments further include a battery free Bluetooth low energy tag device. The low energy tag device may include a transmitter with a reference voltage generator supplying a voltage to an oscillator circuit. The oscillator circuit may include two pairs of semiconductor devices, wherein each pair of a semiconductor device includes a device with a gate node coupled to an antenna positive node interface (Vop) via a capacitor and a drain connected to an antenna negative node interface (Von) and a device with a gate node coupled to an antenna positive node interface (Von) via a capacitor and a drain connected to an antenna negative node interface (Vop). The oscillator circuit may be further connected to a common mode feedback circuit.

BRIEF DESCRIPTION OF THE DRAWINGS

The subject matter disclosed herein is particularly pointed out and distinctly claimed in the claims at the conclusion of the specification. The foregoing and other objects, features, and advantages of the disclosed embodiments will be apparent from the following detailed description taken in conjunction with the accompanying drawings.

DETAILED DESCRIPTION

Figure 1:
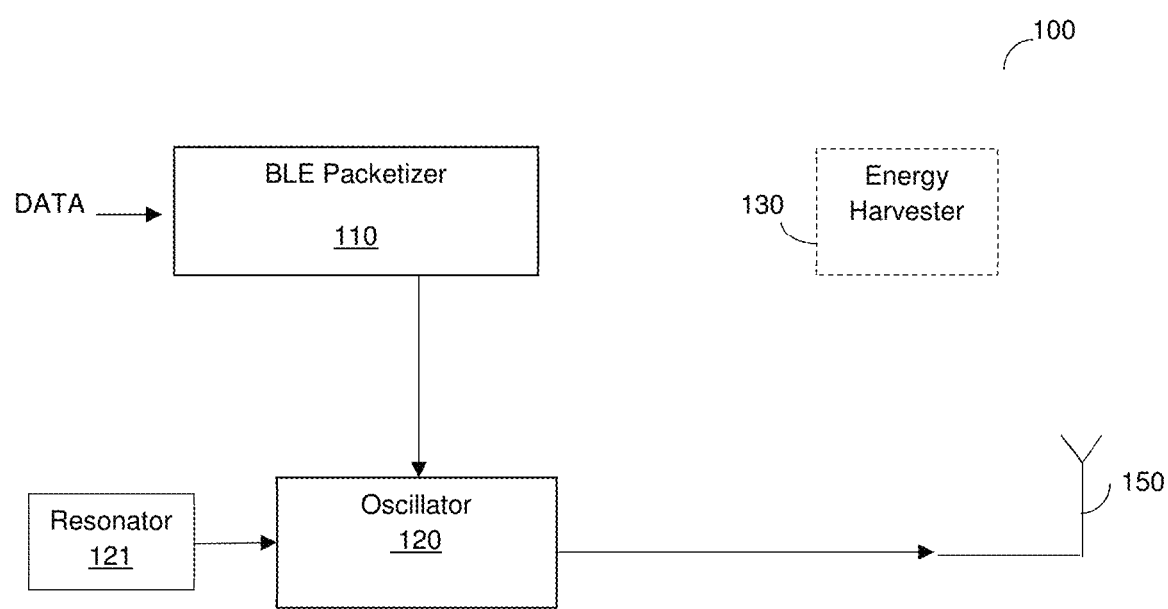
FIG. 1 is a schematic diagram of a Bluetooth Low Energy transmitter utilized to describe some of the disclosed embodiments.

It is important to note that the embodiments disclosed herein are only examples of the many advantageous uses of the innovative teachings herein. In general, statements made in the specification of the present application do not necessarily limit any of the various claimed embodiments. Moreover, some statements may apply to some inventive features but not to others. In general, unless otherwise indicated, singular elements may be in plural and vice versa with no loss of generality. In the drawings, like numerals refer to like parts through several views.

FIG. 1 schematically diagram illustrates a BLE transmitter 100 utilized to describe some of the disclosed embodiments. The BLE transmitter 100 includes a BLE packetizer 110, an oscillator 120, a power source 130, and an antenna 150. These components allow for transmission of wireless signals from the BLE transmitter 100.

For example, the BLE standard 4.0 defines 40 communication channels from 2.4000 GHz to 2.4835 GHz. Out of the 40 channels, 37 channels are used for communicating data and the last three channels (37, 38, and 39) are used as advertising channels to set up connections and send broadcast data. The BLE standard defines a frequency hopping spread spectrum technique in which the radio hops between channels on each connection event. A broadcaster device may advertise on any one of the 3 advertisement channels. The modulation scheme defined for the BLE standard is a Gaussian frequency shift keying (GFSK) modulation. To this end, within each channel, a frequency deviation greater than 185 KHz above the carrier frequency corresponds to a bit with a binary value '1' and a frequency deviation less than −185 KHz corresponds to a bit with a binary value '0'.

The BLE packetizer 110 may receive a signal originated from a processor of a host device. Such a signal may include data or control parameters included in the signal transmitted by the BLE transmitter 100.

The oscillator 120 generates a radio frequency (RF) carrier signal that may carry the data signal generated by the BLE packetizer 110. The modulated RF signal, carrying the data signal, is broadcast by the antenna 150. The power source 130 may be a battery, for example. In some embodiments, the power source 130 may originate from harvested energy from sources such as light, movement, and electromagnetic power such as existing radio frequency transmissions, and Thermoelectric Generators (TEG).

In an example embodiment, the oscillator 120 may be a free-running oscillator, which may be used to directly generate an RF carrier signal. Thus, a free-running oscillator may replace a frequency synthesizer to generate an RF carrier signal. Omitting the frequency synthesizer from the transmitter's design may result in power savings. In the BLE transmitter 100, the free-running oscillator generates a RF carrier signal having a frequency within a specific portion of the wireless spectrum, e.g., the 2.4 GHz wireless spectrum. In some embodiments, the oscillator 120 may be an inlay antenna serving as an oscillator in addition to an antenna.

Typically, the free running oscillator is locked via a phase-locked loop (PLL) to a clock, originating from a crystal oscillator. The oscillator has a resonator 121 that may be also included on a board hosting the processor of the IoT device. The resonator 121 is typically a crystal resonator, a quartz resonator, or microelectromechanical systems (MEMS) based resonator which typically provides a sufficiently accurate and stable time/frequency reference. However, for low-cost, ultra low-power, and small form-factor IoT devices, it is desirable to omit such a resonator.

Often, communication transmitters use power amplifiers (PAs) terminated to an antenna interface at 50 Ohm, built to transmit at power levels higher than 5 dBm. These transmitters may include a frequency synthesis circuit in order to generate a local oscillator. Existing BLE transmitters transmit Frequency Shift Keying (FSK) modulation, by direct modulation of an on-die oscillator frequency, and then using a PA that buffers and amplifies the oscillator power level to levels appropriate for transmission.

Buffering of the oscillator is often useful since it may be impractical to load the antenna impedance on the oscillator as this will introduce large losses to the oscillator which typically uses an on-die Inductor Capacitor (LC) based resonance. In cases where the transmitted power is low (for example, BLE reaching −20 dBm), the power consumption may be dominated by the frequency synthesis circuit.

The PA, Oscillator, and remaining frequency synthesis circuitry of existing BLE systems consume power levels which are much higher than the present embodiments of RF-harvested BLE, because of the needed transmit power and frequency generation from a crystal device, and because of the aim to transmit at power levels higher than −20 dBm, reaching 10 dBm. Embodiments of the BLE transmitter device may transmit at levels below −30 dBm, which enables extremely low Direct Current (DC) power consumption by the transmitting element.

In some embodiments, an LC Oscillator is implemented. A LO center of channel frequency may be achieved via calibration of a digitally controlled capacitor bank, in some embodiments. Data modulation of transmitted data may also be achieved by modulating a capacitor bank at the symbol rate.

One of the major challenges often faced, is to reduce power consumption to enable calibration and transmission operations within an ultra-low power envelope. In some embodiments, the total power consumption of the oscillator may be largely dependent on the quality factor of the inductor. The higher Quality (Q), the lower power that may be needed for the oscillator to meet the startup condition for oscillation. In other words, the onset of oscillation may require less power. Therefore, an inductor with a high quality factor may be desired.

A high-quality factor inductor may be implemented on a printed circuit board and/or substrate (for example, the PET "inlay" material often used with RFID) and connected to the antenna. A quality factor of >100 may be easily achieved, while on die it may be practically possible to get Q on the order of 20 or less, due to parasitic and process limitations in some embodiments. In a lower power implementation, the inductance may be introduced directly at the on-substrate antenna ports which may be printed on the inlay, in some embodiments.

Most LC oscillators use a center tap inductor to feed the supply to the cross-coupled pair. However, in some embodiments, it is not trivial since the high-Q inductor is on the inlay, which is a single conductive layer. There is not an obvious solution to feed the supply via a center-tap on the inlay. Therefore, in some embodiments, a push-pull technique may be used.

Push-pull technology may alleviate the need to have a DC current path toward the antenna, hence requiring a center-tap. The push-pull topology may create a limitation on the lowest vdd if it is desired to keep all devices at an optimal operating point for start-up driven power consumption.

In order to minimize the currents required to enable oscillation over different process and temperature conditions, it may be preferable to control the oscillator bias points (i.e. voltages and currents including the antenna connection nodes). Additional techniques may be implemented to reduce Vdd.

In one embodiment, a no tail current device may be used. In another embodiment the gate and drain of each cross-coupled pair of semiconductors may be separated with one or more capacitors. This may allow the gate voltage to be set independently, Vdd may be lowered to meet a minimum headroom.

In further embodiments, keeping the p-channel (PCH) devices in an optimal operating point with such low Vdd, may require a negative gate voltage. For example, 150 mV may be used. The negative voltage may be referenced to Vdd for PVT tracking. The n-channel device may be supplied with voltages above the oscillator supply (defined by the voltage on top of the transistor channels).

To ensure both PCH and n-channel (NCH) devices have sufficient headroom robustly across PVT, and to avoid mismatch conditions, a common-mode feedback circuit may be used. The gates of the NCH devices may be biased by an error amplifier that senses the middle node of the oscillator (Vop and Von) and a reference of VDD/2, for example. The NCH device bias level may reach values above VDD in some embodiments.

Figure 2:
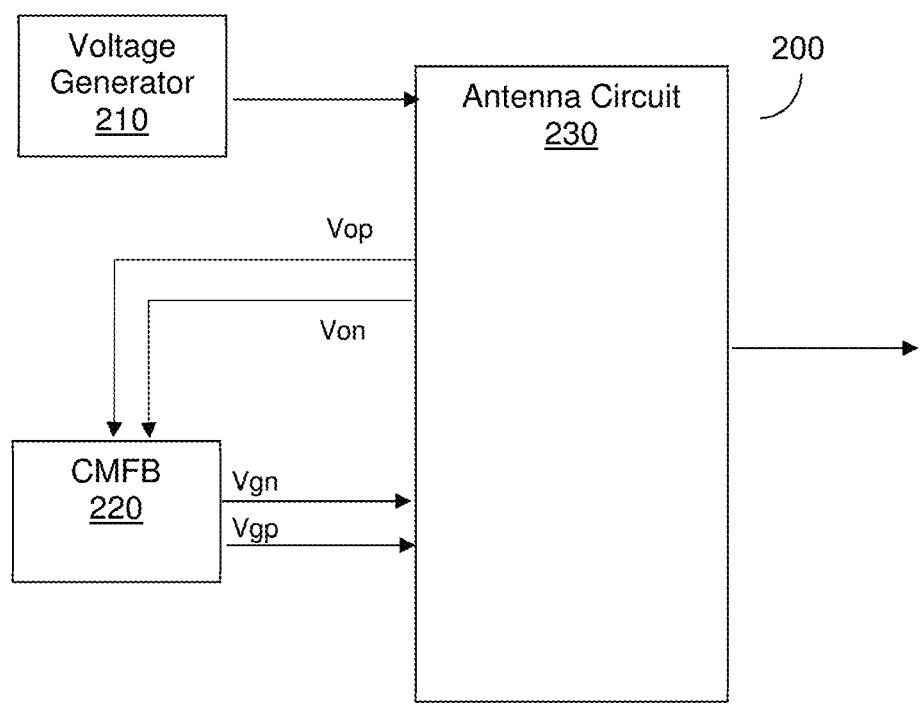
FIG. 2 is a block diagram of a transmitter circuit according to some embodiments.

FIG. 2 is an example block diagram of a transmitter circuit 200 according to some embodiments. Transmitter circuit 200 may include a voltage generator 210, a Common Mode Feedback (CMFB) 220 and an antenna circuit 230.

In some embodiments voltage generator 210 may provide a reference voltage. For example, in some embodiments a 0.2, 0.5 or 1.0V power source may be used to convert to a negative voltage to an antenna circuit 230. For example, −150 mV may be provided to the antenna circuit 230, in some embodiments. In additional embodiments a −100 mV or −50 mV power source may be supplied to the antenna circuit 230 to some or all of the transistors.

In some embodiments, the antenna circuit 230 may include an inlay antenna with outputs Vop and Von as indicated. The inlay antenna is part of the oscillator as well. Vop is the antenna positive node interface and Von is the antenna negative node interface (Von).

In some embodiments, the CMFB 220 may provide 2 or more signals to the antenna circuit 230 and observe at 2 nodes. For example, as illustrated Vgn and Vgp may be provided. The CMFB 220 may be a common-mode feedback circuit. In some embodiments, the CMFB 220 may be used, as mentioned above, to ensure that both p-channel and n-channel transistor devices (in antenna circuit 230) have sufficient headroom and to avoid mismatch conditions. The CMFB 220 may contain one or more operational amplifiers. Finally, CMFB 220 may receive signals from antenna circuit 230 such as Vop and Von, in antenna circuit 230 attached at the interface nodes.

Figure 3:
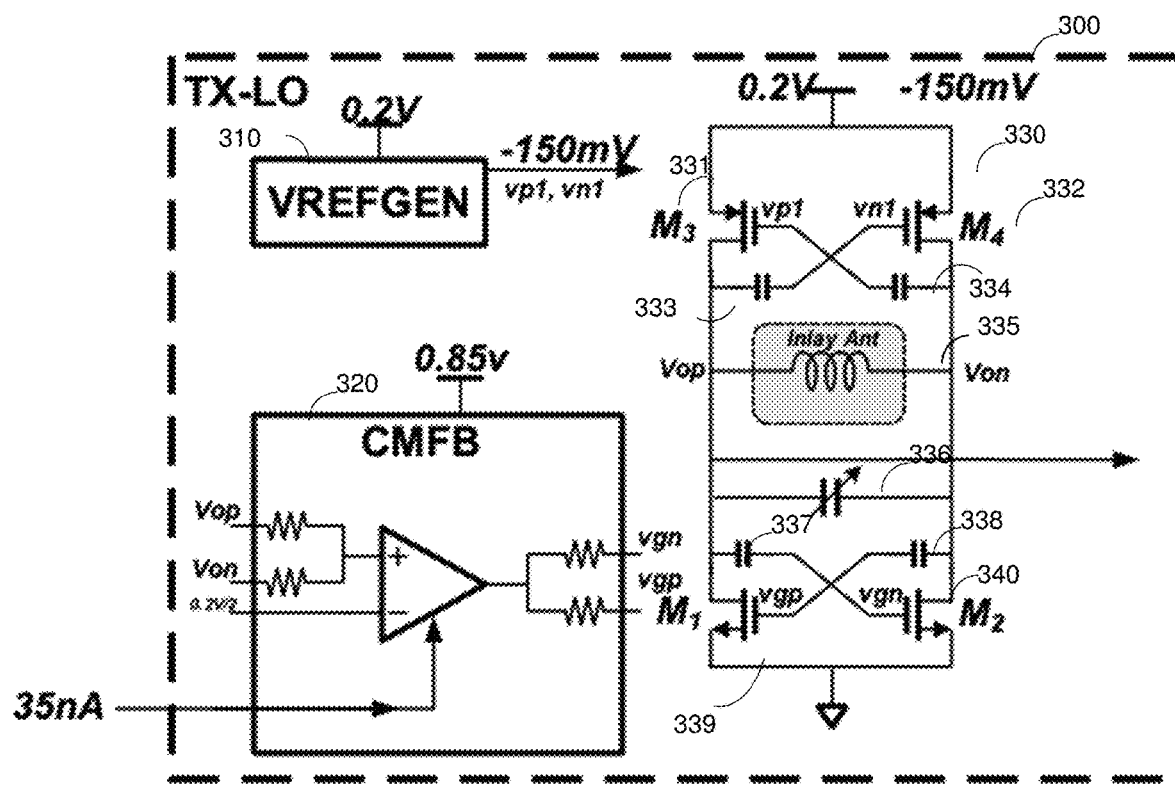
FIG. 3 illustrates a detailed transmitter according to some embodiments.

FIG. 3 illustrates an example diagram of the transmitter circuit 300 according to some embodiments. Detailed transmitter circuit 300 may include reference voltage generator 310, CMFB 320 and antenna circuit 330.

Reference voltage generator 310 may provide a voltage to the primary antenna circuit 330. For example, a reference voltage generator 310 may provide a negative voltage such as −150 mV to transistors 331-332. One skilled in the art would appreciate that this is an exemplary voltage and may be any value such −100 mV, −200 mV, 300 mV, and so on. The reference voltage signal supplied may be provided as signals vp1 and vn1 as indicated. In some embodiments, the reference voltage generator may receive a supply voltage of any magnitude such as 0.2V as indicated.

In some embodiments, a negative gate voltage is provided in order to keep the p-channel devices in an optimal operating point. The negative voltage may be referenced to Vdd for PVT tracking.

The antenna circuit 330 may include transistors 331-332, and 339-340, capacitors 333-334, and 336-338, as well as an inlay antenna 335. In some embodiments, the transmitter circuit 300 and the antenna circuit 330 may not be based on a central-tap antenna. For example, an inlay antenna as illustrated may be used. The inlay antenna may serve as part of the oscillator tank in some embodiments. In some embodiments, signals Vop and Von may be maintained at low voltage levels enabled by the transistors.

In some embodiments, the transistors 331-332 may be cross coupled to capacitors such as the capacitors 333-334. The transistors 331-332 may be separated from the transistors 339-340 by an inlay antenna such as the inlay antenna 335. In some embodiments, the transistors 339-340 may also be cross coupled to capacitors such as the capacitors 337-338. Similarly, the capacitor 336 may be attached to the circuit between the capacitors 337-338 and the inlay antenna 335. In some embodiments the transistors 331 and 339 may be p-channel transistors while the transistors 332 and 340 are n-channel transistors. It would appreciate that many variations on the transistors is possible.

In some embodiments, the gate and drain of each cross coupled transistor pair may be separated with one or more capacitors. This allows the gate voltage to be set independently. Vdd may be further lowed to meet minimum headroom. In some embodiments, the gate node of one or more of the cross coupled transistors may be coupled to the antenna positive node interface (Vop) via a capacitor and the drain of one or more of the transistors connected to the antenna negative node interface (Von) as illustrated.

In some embodiments, the CMFB 320 may be a common-mode feedback circuit, as illustrated, the CMFB 320 may include an operation amplifier 321. The operation amplifier 321 may take in inputs from the inlay antenna 335. For example, the operation amplifier 321 may take in Vop and Von from an interface of the inlay antenna 335 which may be directly connected, coupled or indirectly connected to the inlay antenna 335. Similarly, the operation amplifier 321 may receive a current source as an input. The current source may be any current value such as 30, 35, or 40 nA, for example. Similarly, the CMFB 320 may output signals to the transistors 339-340. In some embodiments, the output signals may be vgn and vgp as indicated. The CMFB 320 may be attached, connected or coupled to antenna circuit 330 in order to control the voltage level of the antenna ports.

The CMFB 320 may be implemented in some embodiments in order to ensure that both p-channel and n-channel devices have sufficient headroom across PVT. Similarly, the CMFB 320 may be used to help avoid mismatch conditions. In some embodiments, the gates of the n-channel device(s) may be biased by an error amplifier which senses the middle node of the oscillator (Vop and Von) as well as a reference of Vdd/2. The n-channel device bias levels may reach values above Vdd (VDD refers here to the 0.2v supply).

Some examples of use cases for such Bluetooth low energy transmitter devices include manufacturing, distribution, retail and ownership. In manufacturing, tracking pallets, work in progress, and finished goods may be accomplished with one or more tags/transmitter devices. Companies may improve yield as well as increase their traceability. In distribution, for example, disclosed embodiments may be used in asset tracking for distribution centers and vehicles. Similarly, cold chain, delivery verification, and counterfeit and grey market detection may all implement and use various embodiments of the disclosed transmitters.

In some embodiments, a Bluetooth low energy transmitter is all or part of one or more IoT sensors. For example, the transmitter may be a tag or small sensor device on one or more of the above examples.

In one complete exemplary embodiment, a Bluetooth low energy transmitter includes a reference voltage generator supplying voltage at −150 mV. The reference voltage transmitter may be supplied by a 0.2V source. The −150 mV is supplied to a circuit connected at an n-channel and p-channel transistor. The n-channel and p-channel transistors are each connected to a capacitor and cross coupled. The transistors are further connected to an inlay antenna which is connected to a common mode feedback circuit containing an operational amplifier.

The inlay antenna also functions as an oscillator and may further be connected to a capacitor. In addition to the capacitor the antenna may be connected to two additional transistors. The additional transistors may be cross coupled and also each connected or coupled to a capacitor. Finally, the additional transistors may be grounded.

It should be appreciated that the voltages and other values are all representative and may be changed as appropriate. Further, various transistors may be used in addition to different capacitance capacitors.

It should be understood that any reference to an element herein using a designation such as "first," "second," and so forth does not generally limit the quantity or order of those elements. Rather, these designations are generally used herein as a convenient method of distinguishing between two or more elements or instances of an element. Thus, a reference to first and second elements does not mean that only two elements may be employed there or that the first element must precede the second element in some manner. Also, unless stated otherwise a set of elements comprises one or more elements. In addition, terminology of the form "at least one of A, B, or C" or "one or more of A, B, or C" or "at least one of the group consisting of A, B, and C" or "at least one of A, B, and C" used in the description or the claims means "A or B or C or any combination of these elements." For example, this terminology may include A, or B, or C, or A and B, or A and C, or A and B and C, or 2A, or 2B, or 2C, and so on.

All examples and conditional language recited herein are intended for pedagogical purposes to aid the reader in understanding the principles of the disclosed embodiments and the concepts contributed by the inventor to furthering the art, and are to be construed as being without limitation to such specifically recited examples and conditions. Moreover, all statements herein reciting principles, aspects, and embodiments, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

What is claimed is:

1. A low energy transmitter, comprising:
   an oscillator circuit; and
   a reference voltage generator adapted to supply a voltage to the oscillator circuit, wherein the oscillator circuit includes two pairs of semiconductor devices, wherein each pair of a semiconductor device includes a device with a gate node coupled to an antenna positive node interface (Vop) via a capacitor and a drain connected to an antenna negative node interface (Von) and a device with a gate node coupled to an antenna positive node interface (Von) via a capacitor and a drain connected to an antenna negative node interface (Vop), wherein the oscillator circuit is connected to a common mode feedback circuit;
   wherein an antenna is coupled between the antenna positive node interface and the antenna negative node interface, the antenna being an oscillating inlay antenna, and wherein an input and output of the oscillating inlay antenna is maintained at a low voltage.

2. The transmitter of claim 1, wherein each semiconductor device includes cross coupled n-type and p-type transistors.

3. The transmitter of claim 1, wherein the oscillator circuit is a negative resistance oscillator.

4. The transmitter of claim 1, wherein a gate and drain of the first pair of semiconductors are coupled to the first and second capacitor respectively.

5. The transmitter of claim 1, wherein a gate and drain of the second pair of semiconductors are coupled to the third and fourth capacitor respectively.

6. The transmitter of claim 1, wherein the supplied voltage is a negative gate voltage.

7. The transmitter of claim 6, wherein the negative gate voltage is −150 mV.

8. The transmitter of claim 1, wherein the voltage generator is powered by a 0.2V source.

9. The transmitter of claim 1, wherein the common mode feedback circuit receives a 0.2V source as input.

10. The transmitter of claim 1, wherein the first and second pair of semiconductors are complimentary devices respectively.

11. A battery free low-energy communication tag, comprising:
    a transmitter including:
      a reference voltage generator supplying a voltage to an oscillator circuit; and
      an oscillator circuit comprising two pairs of semiconductor devices, wherein each pair of a semiconductor device includes a device with a gate node coupled to an antenna positive node interface (Vop) via a capacitor and a drain connected to an antenna negative node interface (Von) and a device with a gate node coupled to an antenna positive node interface (Von) via a capacitor and a drain connected to an antenna negative node interface (Vop), wherein the oscillator circuit is connected to a common mode feedback circuit;
    wherein an antenna is coupled between the antenna positive node interface and the antenna negative node interface, the antenna being an oscillating inlay antenna, and wherein an input and output of the oscillating inlay antenna is maintained at a low voltage.

12. A Bluetooth low energy communication device, comprising:
    a transmitter;
    an oscillator circuit comprising two pairs of semiconductor devices, wherein each pair of a semiconductor device includes a device with a gate node coupled to an antenna positive node interface (Vop) via a capacitor and a drain connected to an antenna negative node interface (Von) and a device with a gate node coupled to an antenna positive node interface (Von) via a capacitor and a drain connected to an antenna negative node interface (Vop), wherein
    the oscillator circuit connected to a common mode feedback circuit; and a reference voltage generator supplying a voltage to the oscillator circuit;

wherein an antenna is coupled between the antenna positive node interface and the antenna negative node interface, the antenna being an oscillating inlay antenna, and wherein an input and output of the oscillating inlay antenna is maintained at a low voltage.

13. The device of claim 12, wherein an input and output to the oscillating inlay antenna is maintained at a low voltage.

14. The device of claim 12, wherein the first pair of semiconductors include a first p-channel semiconductor and a first n-channel semiconductor.

15. The device of claim 12, wherein the second pair of semiconductors include a second p-channel semiconductor and a second n-channel semiconductor.

16. The device of claim 12, wherein a gate and drain of the first pair of semiconductors are coupled to the first and second capacitor respectively.

17. The device of claim 12, wherein a gate and drain of the second pair of semiconductors are coupled to the third and fourth capacitor respectively.

18. The device of claim 12, wherein the supplied voltage is a negative gate voltage.

19. The device of claim 12, wherein the negative gate voltage is −150 mV.

* * * * *